United States Patent
Takiguchi et al.

(10) Patent No.: US 12,393,128 B2
(45) Date of Patent: Aug. 19, 2025

(54) EXPOSURE APPARATUS, EXPOSURE METHOD, AND ARTICLE MANUFACTURING METHOD

(71) Applicant: CANON KABUSHIKI KAISHA, Tokyo (JP)

(72) Inventors: Takahiro Takiguchi, Tochigi (JP); Jun Kawashima, Tochigi (JP); Jun Moizumi, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/296,044

(22) Filed: Apr. 5, 2023

(65) Prior Publication Data
US 2023/0333490 A1    Oct. 19, 2023

(30) Foreign Application Priority Data
Apr. 14, 2022    (JP) .................. 2022-067118

(51) Int. Cl.
*G03F 7/00*    (2006.01)

(52) U.S. Cl.
CPC .......... *G03F 7/70891* (2013.01); *G03F 7/706* (2013.01)

(58) Field of Classification Search
CPC .. G03F 7/70525; G03F 7/70533; G03F 7/706; G03F 7/70891
See application file for complete search history.

(56) References Cited

U.S. PATENT DOCUMENTS

| | | | |
|---|---|---|---|
| 8,810,773 B2 | 8/2014 | Akhssay | |
| 2011/0063593 A1* | 3/2011 | Kanda | G03B 27/42 355/53 |
| 2015/0077727 A1* | 3/2015 | Kaneko | G03F 7/3042 355/27 |
| 2017/0261863 A1* | 9/2017 | Downes | G03F 7/70491 |

(Continued)

FOREIGN PATENT DOCUMENTS

| | | |
|---|---|---|
| CN | 1322971 A | 11/2001 |
| CN | 1322972 A | 11/2001 |

(Continued)

OTHER PUBLICATIONS

Office action issued in Taiwanese Appln. No. 112113236 dated May 19, 2025.

*Primary Examiner* — Steven H Whitesell
(74) *Attorney, Agent, or Firm* — ROSSI, KIMMS & McDOWELL LLP (57) ABSTRACT

An exposure apparatus that performs an exposure operation of exposing a substrate via a projection optical system is provided. The apparatus includes a temperature regulator configured to regulate a temperature distribution on an optical element of the projection optical system, and a controller configured to perform, in an exposure operation period in which the exposure operation is executed, a first process of controlling the temperature regulator so as to reduce a change of aberration of the projection optical system caused by execution of the exposure operation. In accordance with detection of a predetermined event before the exposure operation period, the controller performs, before performing the first process, a second process for reducing the aberration of the projection optical system using a method different from the first process.

9 Claims, 11 Drawing Sheets

(56) References Cited

U.S. PATENT DOCUMENTS

2020/0409276 A1* 12/2020 Miyano ................... G03F 7/706
2021/0088781 A1*  3/2021 Yamamoto .............. G03F 7/706

FOREIGN PATENT DOCUMENTS

| | | | |
|---|---|---|---|
| CN | 1329286 | A | 1/2002 |
| CN | 1329287 | A | 1/2002 |
| CN | 1831652 | A | 9/2006 |
| JP | 2007317847 | A | 12/2007 |
| JP | 5266641 | B2 | 8/2013 |
| JP | 5334945 | B2 | 11/2013 |
| WO | 2006025408 | A1 | 3/2006 |

* cited by examiner

EXPOSURE APPARATUS, EXPOSURE METHOD, AND ARTICLE MANUFACTURING METHOD

BACKGROUND OF THE INVENTION

Field of the Invention

The present invention relates to an exposure apparatus, an exposure method, and an article manufacturing method.

Description of the Related Art

In the manufacturing of an article such as a semiconductor device, an exposure apparatus that illuminates an original (a reticle or a mask) by an illumination optical system, projects a pattern of the original onto a substrate via a projection optical system, and exposes the substrate is used. Since the imaging characteristics of the projection optical system fluctuate due to irradiation of exposure light, the imaging characteristics are corrected properly.

For example, Japanese Patent No. 5266641 describes that the imaging characteristics are corrected by applying a temperature distribution to an optical element using a heater element. However, when the imaging characteristics are corrected using the heater element as described in Japanese Patent No. 5266641, if the time constant concerning the temperature of the projection optical system is smaller than the time constant concerning heating by the heater element, the correction accuracy decreases. On the other hand, Japanese Patent No. 5334945 describes a method of starting correction before the imaging characteristics of the projection optical system fluctuate.

Japanese Patent No. 5334945 describes that a correction mechanism is controlled precedingly based on the change of the gradient of the time-temperature characteristic of the imaging characteristics. However, depending on the detection timing of the change of the gradient, the correction residual cannot be reduced sufficiently.

SUMMARY OF THE INVENTION

In consideration of the above-described problems, the present invention provides a technique advantageous in correcting the aberration of a projection optical system with high accuracy.

The present invention in its one aspect provides an exposure apparatus that performs an exposure operation of exposing a substrate via a projection optical system, the apparatus including a temperature regulator configured to regulate a temperature distribution on an optical element of the projection optical system, and a controller configured to perform, in an exposure operation period in which the exposure operation is executed, a first process of controlling the temperature regulator so as to reduce a change of aberration of the projection optical system caused by execution of the exposure operation, wherein, in accordance with detection of a predetermined event before the exposure operation period, the controller performs, before performing the first process, a second process for reducing the aberration of the projection optical system using a method different from the first process.

Further features of the present invention will become apparent from the following description of exemplary embodiments (with reference to the attached drawings).

DESCRIPTION OF THE EMBODIMENTS

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate.

Furthermore, in the attached drawings, the same reference numerals are given to the same or similar configurations, and redundant description thereof is omitted.

First Embodiment

Figure 1:
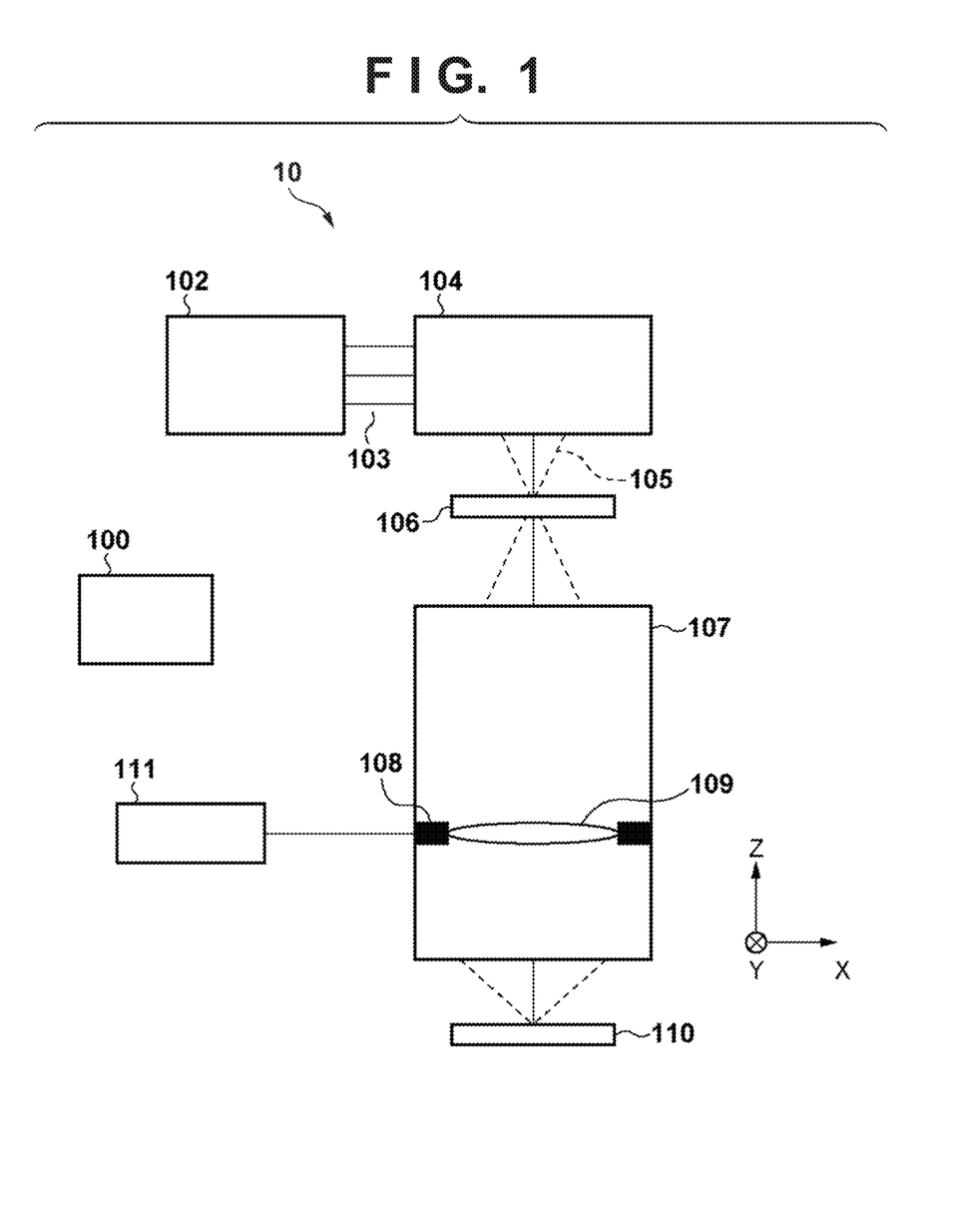
FIG. 1 is a view schematically showing the arrangement of an exposure apparatus.

FIG. 1 schematically shows the arrangement of an exposure apparatus 10 according to the first embodiment. The exposure apparatus 10 schematically performs an exposure operation of exposing a substrate 110 via a projection optical system 107. In this specification and the drawings, directions are indicated based on an XYZ coordinate system in which a plane parallel to a surface on which the substrate 110 is arranged is set as an X-Y plane, as shown in FIG. 1. The exposure apparatus 10 includes a light source 102, an illumination optical system 104, the projection optical system 107, a controller 100, and a temperature controller 111. In an exposure operation, the illumination optical system 104 illuminates an original 106 with light (exposure light) from the light source 102, and the pattern of the original 106 is projected onto the substrate 110 by the projection optical system 107 to expose the substrate 110. The exposure apparatus 10 may be formed as an exposure apparatus that exposes the substrate 110 in a state in which the original 106 and the substrate 110 are stopped still or as an exposure apparatus that exposes the substrate 110 while scanning the original 106 and the substrate 110. In general, the substrate 110 includes a plurality of shot regions, and an exposure operation is performed on each shot region.

The light source 102 can include, for example, an excimer laser, but may include another light-emitting device, or may be an electron gun. The excimer laser can generate, for example, light having a wavelength of 248 nm or 193 nm, but light of another wavelength can also be generated. The projection optical system 107 can include an optical element 109 and a temperature regulator 108 that controls the temperature distribution on the optical element 109. The temperature regulator 108 can reduce the change of the optical characteristics of the projection optical system 107 by applying thermal energy to the optical element 109 to change the refractive index distribution and/or the surface shape of the optical element 109. The thermal energy applied to the optical element 109 by the temperature regulator 108 can include positive energy and negative energy. Application of positive energy to the optical element 109 represents heating of the optical element 109, and application of negative energy to the optical element 109 represents cooling of the optical element 109.

The temperature regulator 108 may be arranged to be tightly adhered to the optical element 109, and the thermal energy transmission between the temperature regulator 108 and the optical element 109 will be efficient in such a case. Alternatively, the temperature regulator 108 may be arranged spaced apart from the optical element 109. This arrangement is advantageous in the point that a mechanical force will not be applied to the optical element 109 by the temperature regulator 108, and in the point that the temperature regulator 108 will not damage the optical element 109 by scratching or the like.

It is preferable to arrange the temperature regulator 108 outside the effective diameter (optical path) of the optical element 109 so the temperature regulator 108 will not block the light irradiation to the substrate 110. For example, the temperature regulator 108 can be arranged on the outer edge portion of a lens serving as the optical element 109, the front surface of the lens, or the back surface of the lens. Alternatively, the temperature regulator 108 may be arranged inside the effective diameter in a range that will not influence the optical performance of the projection optical system 107. As an example of such an arrangement, for example, a thin heating wire may be arranged in the effective diameter of the optical element or a heat transmitting element which has a high light transmittance may be arranged in the effective diameter of the optical element.

When arranging the temperature regulator 108 on the outer periphery of the optical element 109, the optical element 109 is preferably arranged at or near a pupil plane of the projection optical system 107, but the temperature regulator 108 may be arranged spaced away from the pupil plane of the projection optical system 107.

In a period in which the exposure operation is executed and a period in which the exposure operation is not executed, the temperature regulator 108 can change the thermal energy to be applied to the optical element 109 in synchronization with the optical characteristics of the projection optical system 107 which change moment by moment. In this embodiment, the temperature controller 111 controls the temperature regulator 108. The temperature controller 111 can control the amount of thermal energy applied to the optical element 109 and the continuation time of the application, and the temperature distribution on the optical element 109 can be controlled as a result. Here, information required for control of the temperature regulator 108 can be generated based on the result of measuring the optical characteristics of the projection optical system 107 on the image plane (the plane on which the substrate 110 is arranged) of the projection optical system 107. Alternatively, information required for control of the temperature regulator 108 may be decided in advance through measurement or the like. Information required for control by the temperature controller 111 is obtained by measuring, in advance, the aberration generation amount of the optical element 109 upon being applied with heat under the exposure condition to be executed. Based on the information obtained by the measurement, the controller 100 decides the thermal energy to be applied to the optical element 109 during exposure, and gives an instruction including the information to the temperature controller 111. The temperature controller 111 applies the thermal energy to the temperature regulator 108 using a control value corresponding to the given instruction. Control of the thermal energy to be applied to the optical element 109 by the temperature regulator 108 can be implemented by, for example, control of the current value to be applied to the heating wire if the temperature regulator 108 includes the heating wire. Alternatively, control of the thermal energy to be applied to the optical element 109 by the temperature regulator 108 may be implemented by, for example, control of the physical distance or thermal distance between the optical element 109 and the temperature regulator 108.

The controller 100 can control the light source 102, the illumination optical system 104, the projection optical system 107, and the temperature controller 111. The controller 100 can be formed from, for example, a Programmable Logic Device (PLD) such as a Field Programmable Gate Array (FPGA), an Application Specific Integrated Circuit (ASIC), a general-purpose or dedicated computer installed with a program, or a combination of all or some of these components. Note that in this embodiment, the controller 100 and the temperature controller 111 are formed as separate components, but the controller 100 may be formed so as to include the function of the temperature controller 111.

Figure 2A:
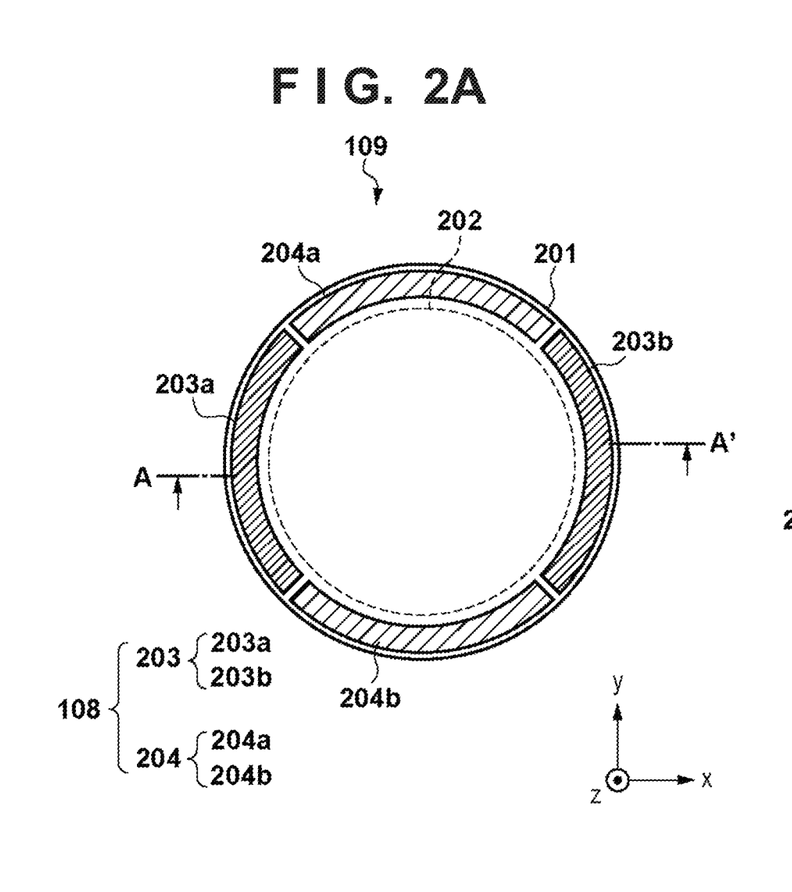
FIGS. 2A and 2B are views showing an arrangement example of an optical element and a temperature regulator.
Figure 2B:
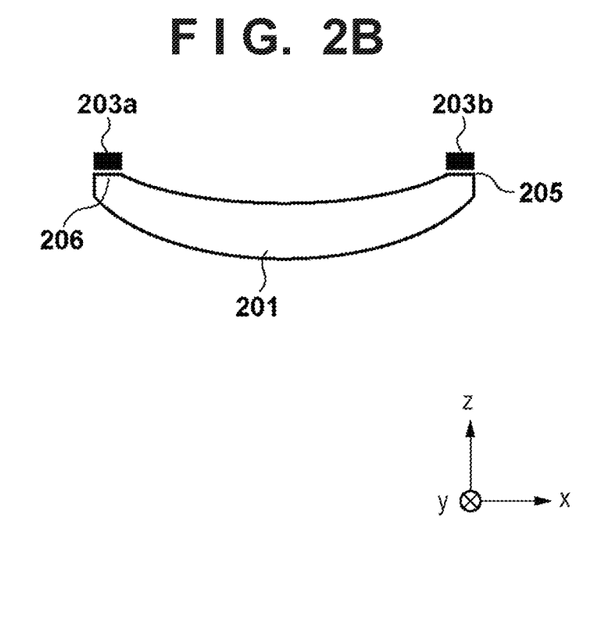

FIGS. 2A and 2B show an arrangement example of the optical element 109 and the temperature regulator 108. FIG. 2A is a plan view when viewed from the Z direction, and FIG. 2B is a sectional view taken along a line A-A' in FIG. 2A. The optical element 109 can include a lens 201. The temperature regulator 108 can include a first temperature regulator 203 formed from heater elements 203a and 203b, and a second temperature regulator 204 formed from heater elements 204a and 204b.

A circle 202 drawn with a broken line represents the light beam effective diameter of the lens 201. Outside the light beam effective diameter, the heater element 203a and the heater element 203b are arranged at positions facing each other along the Y direction with the center of the lens 201 interposed therebetween, and the heater element 204a and the heater element 204b are arranged at positions facing each other along the X direction with the center of the lens 201 interposed therebetween. Each of the heater elements 203a, 203b, 204a, and 204b can have an arc shape corresponding to a length of one quarter of the circumference of the lens 201. Each of the heater elements 203a, 203b, 204a, and 204b can be formed by, for example, a flexible cable including a heating wire, and heat is generated by applying a current to the heating wire, so that a temperature distribution can be generated in the lens 201.

For example, the heater elements 203a, 203b, 204a, and 204b can be arranged spaced apart from the planar portion of the lens 201 by 10 to 100 μm. The heat generated by each of the heater elements 203a, 203b, 204a, and 204b can be transferred to the lens 201 via a medium 205 between each of the heater elements 203a, 203b, 204a, and 204b and the lens 201, respectively. The medium 205 can be, for example, a gas such as air or nitrogen. The heater elements 203a, 203b, 204a, and 204b need not directly face the lens 201 via the medium 205. Each of the heater elements 203a, 203b, 204a, and 204b may have, for example, a structure in which a metal having high thermal conductivity sandwiches the heating wire.

In the example shown in FIG. 2B, the heater elements 203a, 203b, 204a, and 204b are arranged on the planar portion (on the side of the illumination optical system 104) of the lens 201. However, the heater elements 203a, 203b, 204a, and 204b may be arranged below (on the side of the substrate 110) the lens 201 or on the outer edge portion of the lens 201. The lens 201 can include a heated surface 206 which is heated by the heater elements 203a, 203b, 204a, and 204b. The heated surface 206 may be flat or curved. The heated surface 206 can be, for example, a roughened surface (a surface in the manner of frosted glass).

Figure 3A:
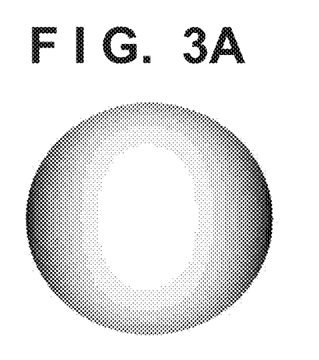
FIGS. 3A and 3B are views each showing the temperature distribution on a lens heated by the temperature regulator.
Figure 3B:
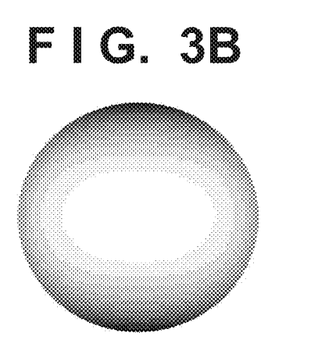

FIG. 3A exemplarily shows the temperature distribution on the lens 201 heated by the second temperature regulator 204. At this time, astigmatism is generated on the surface of the substrate 110 in the positive direction. FIG. 3B exemplarily shows the temperature distribution on the lens 201 heated by the first temperature regulator 203. The temperature distribution shown in FIG. 3B is a temperature distribution that has the opposite phase of the temperature distribution shown in FIG. 3A. The temperature distribution shown in FIG. 3B generates astigmatism on the surface of the substrate 110 in the negative direction. In this manner, positive astigmatism and negative astigmatism can be generated by heating the lens 201 by the first temperature regulator 203 and the second temperature regulator 204. Compared to an arrangement in which the positive astigmatism and the negative astigmatism are generated by a combination of heating and cooling by using an element such as a Peltier element, this kind of arrangement is advantageous in that the arrangement of the temperature regulator 108 can be simplified.

Figure 4:
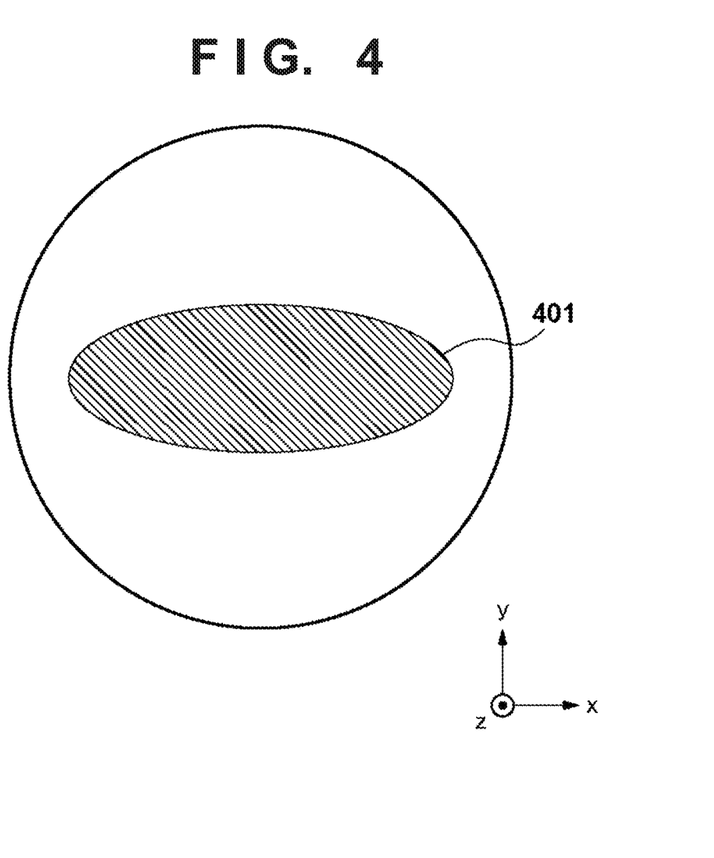
FIG. 4 is a view exemplarily showing the distribution of a light beam that passes through a lens of a projection optical system of a scanning exposure apparatus.

Here, consider a case in which the exposure apparatus 10 shown in FIG. 1 is a scanning exposure apparatus that scans the original 106 and the substrate 110 with respect to a long slit-shaped light beam (exposure light) in the X direction. In this case, the intensity distribution of the light beam that passes through the projection optical system 107 at the time of the exposure operation can be as that shown by a hatched portion 401 of FIG. 4. In this case, the temperature distribution on the lens 201 (optical element 109) generated by the absorption of the light beam will differ in the X direction and the Y direction. This can cause a large amount of astigmatism to be generated in the projection optical system 107.

Hence, a temperature distribution can be applied to the lens 201 by the temperature regulator 108 so as to reduce the astigmatism. The astigmatism generated by the temperature regulator 108 and the astigmatism generated when the lens 201 absorbs a light beam have opposite signs. Therefore, the astigmatism generated by the absorption of the light beam by the lens 201 can be reduced (corrected) by the astigmatism generated by the temperature regulator 108. Note that in the following description, "astigmatism" represents the astigmatism of the projection optical system 107 unless otherwise specified.

The change (temporal change characteristic) of the astigmatism generated by the temperature regulator 108 may be different from the change (temporal change characteristic) of the astigmatism generated by the absorption of the light beam by the lens 201. In this case, the current to be supplied to the heating wire of each of the heater elements 203a, 203b, 204a, and 204b is controlled to control the change of the astigmatism. With this, the astigmatism generated by the absorption of the light beam by the lens 201 can be canceled with higher accuracy.

Figure 5:
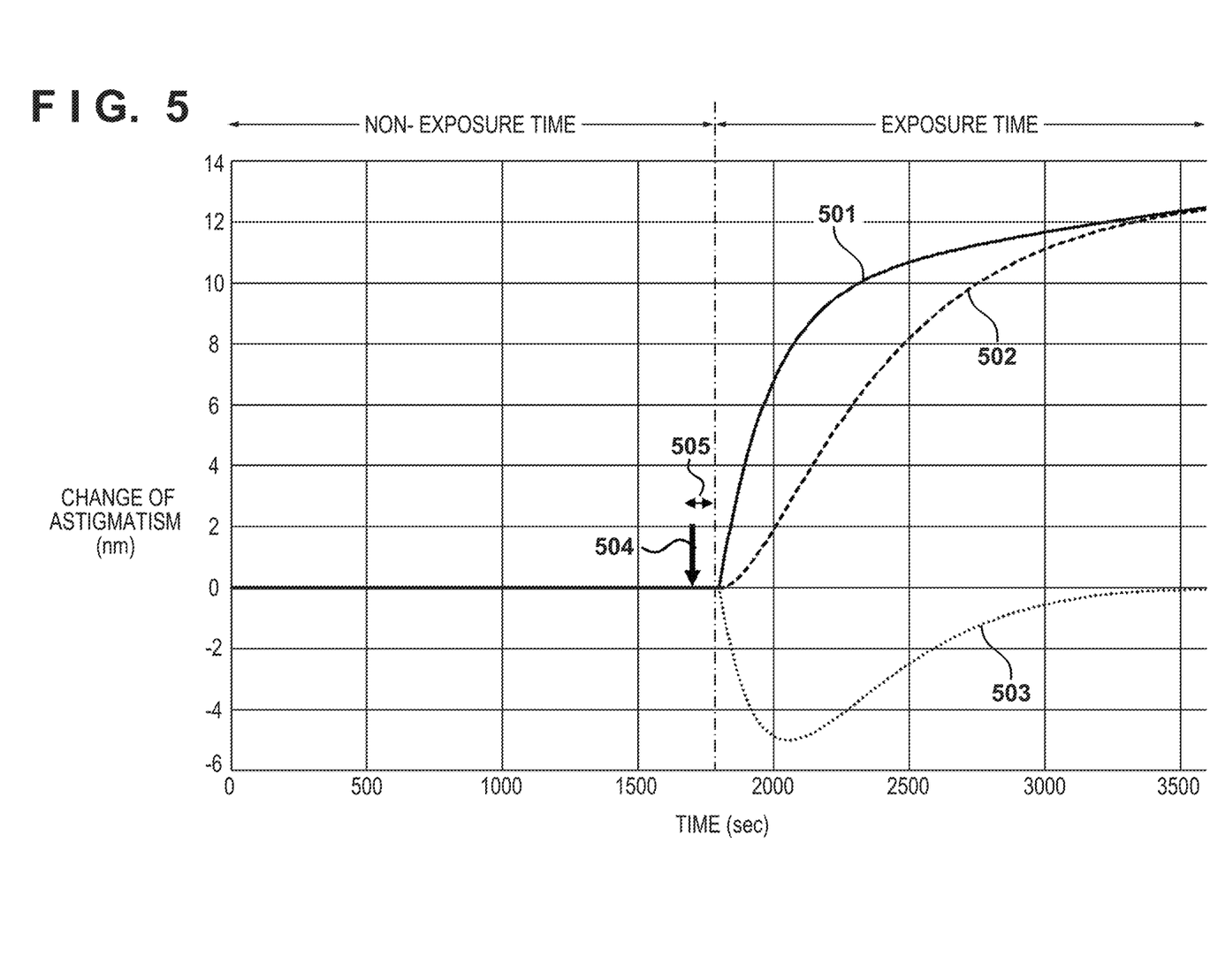
FIG. 5 is a graph exemplarily showing the temporal characteristic of the change of the astigmatism.

FIG. 5 exemplarily shows the temporal characteristic of the change of the astigmatism. In FIG. 5, "exposure time" refers to an exposure operation period in which the exposure operation is executed, and "non-exposure time" refers to a non-exposure operation period preceding the exposure operation period, in which the exposure operation is not executed. The "exposure operation period" refers to the period from the start of the exposure operation on the first substrate to the end of the exposure operation on the last substrate in one lot. The "exposure operation period" also includes the period between shots in which no exposure is actually executed, and the substrate replacement period. The "non-exposure operation period" can include the period from the startup of the apparatus or the time at which the apparatus is in an idle state to the start of the exposure operation on the first substrate in the lot.

In FIG. 5, a curve 501 expresses the time-series change of the astigmatism generated by the absorption of heat of the exposure light by the lens 201 in the exposure operation period after the non-exposure operation period. An ideal method of reducing or canceling the astigmatism generated by the absorption of heat of the exposure light by the lens 201 is generating, by heating the lens 201 by the temperature regulator 108, the astigmatism that changes in a curve corresponding to the curve 501 with the opposite sign. However, as expressed by a curve 502, if the temperature regulator 108 continuously heats the lens 201 at a predetermined temperature, the astigmatism generated by this heating operation tends to change by a slower time constant than that of the curve 501. Hence, the astigmatism expressed by the curve 501 cannot be completely corrected (canceled), and the correction residual as expressed by a curve 503 can be generated.

In order to compensate for the inability of the correction by heating the lens 201 by the temperature regulator 108 to follow the change of the aberration during the exposure time, it is conceivable to additionally execute an aberration correction process at the time at which the aberration exceeds an allowable value. However, if the execution frequency of the additional correction process increases, productivity decreases. On the other hand, it is also conceivable to predict, using information of the lot in process and information of the succeeding lot, the amount of aberration generated in each of the two lots, and performing correction based on the prediction result. However, it is difficult to perform such the prediction with high accuracy due to the problems described below.

In the following description, a series of exposure operations on respective substrates in a lot of substrates (a unit of a plurality of substrates to be processed under the same condition) is referred to as "lot processing". In the exposure apparatus 10 or an external apparatus (such as a server), when a process instruction including the detailed information of the process to be executed for the lot is generated, and the process instruction is submitted to the exposure apparatus 10, the lot processing is started. This process instruction is referred to as an "exposure job" hereinafter. The exposure job is a lot processing start instruction, and includes information concerning the conditions (for example, exposure amount, angle of view, scanning speed, transmittance of original, and the like) of the exposure operation on each substrate in the lot. Upon receiving the exposure job, the controller 100 performs an aberration correction process, which will be described below in detail, in accordance with the conditions of the exposure operation included in the exposure job, and then starts the exposure operation in the lot.

Since the start timing of the exposure operation in the lot processing is planned and decided by the user, the accurate time difference between the submission timing of the exposure job of the lot processing and the start timing of the exposure operation in the lot processing corresponding to this is unknown. Therefore, the start timing of the exposure operation can be decided by at least one of statistical calculation from the past operational performance of the apparatus, prediction from the lot information and the apparatus status at the reception timing of the exposure job, and the like. The start timing of the exposure operation obtained based on the time decided as described above is referred to as an "assumed start timing" hereinafter.

If the submission timing of the exposure job of the succeeding lot processing is immediately before the completion of the currently executing lot processing, the lens 201 cannot be sufficiently heated by the start of the succeeding lot processing, so that the correction residual can increase. Also, if the next exposure job is submitted while the exposure apparatus 10 is in the idle state, the correction cannot follow the change of the aberration immediately after the start of the lot processing, so that the correction residual can increase. For example, in FIG. 5, a timing 504 indicates the reception timing of the exposure job by the controller 100. A period 505 indicates the period from the reception timing 504 of the exposure job to the start of the exposure operation on the first substrate in the lot. In the example shown in FIG. 5, the period 505 is of about 100 sec. Even if the correction by heating the lens 201 by the temperature regulator 108 based on the prediction of the amount of aberration generated in the lot is executed within this period, it is difficult for the correction to follow the change of the astigmatism generated by the absorption of the light beam by the lens 201 during the exposure time.

Figure 6:
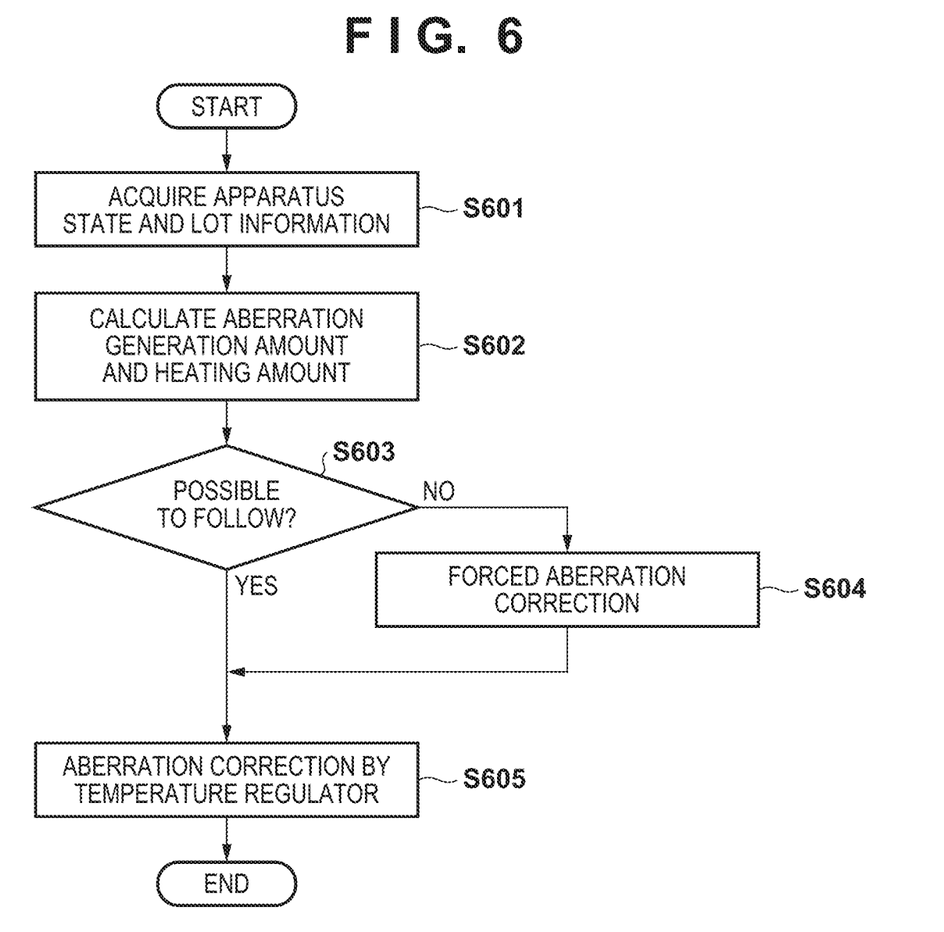
FIG. 6 is a flowchart illustrating an astigmatism correction process.

In this embodiment, aberration correction that can cope with the problems as described above is performed. FIG. 6 shows a flowchart illustrating an astigmatism correction process in this embodiment. This process is started in accordance with the reception of an exposure job by the controller 100. In step S601, the controller 100 acquires the apparatus status and the lot information. The apparatus status is status information including information as to whether an exposure operation in lot processing is currently executed, information as to whether lot processing has been interrupted, information as to whether there is a substrate conveyance delay, and the like. The lot information is information included in the received exposure job, and can be information concerning the conditions (for example, exposure amount, angle of view, scanning speed, transmittance of original, and the like) of the exposure operation on each substrate in the lot.

In step S602, the controller 100 predicts the aberration generation amount based on the apparatus status and the lot information acquired in step S601, and calculates the heating amount to be applied to the lens 201 by the temperature regulator 108 required to correct the predicted aberration. In calculation of the heating amount, in order to prevent a failure of the temperature regulator 108, a restriction may be provided so as not to exceed the upper limit of the settable heating amount.

In step S603, the controller 100 determines, if the heating amount calculated in step S602 is applied to the lens 201 by the temperature regulator 108, whether the correction by the temperature regulator 108 can follow the change of the astigmatism generated by the heat absorption by the lens 201 during the exposure time. In an example, if the time difference between the assumed start timing of the exposure operation and the reception timing of the exposure job is larger than a predetermined threshold value, it is determined that the correction can follow the change of the astigmatism. The predetermined threshold value can be decided based on the result of correction by the heating by the temperature regulator 108. Alternatively, the predetermined threshold value may be decided based on the result of modeling and simulation of the astigmatism generated by the heating by the temperature regulator 108. The aberration generation amount for the submitted lot processing may be predicted, and the predetermined threshold value may be dramatically changed base on the predicted aberration generation amount. In another example, if the difference between the pre-measured value of the astigmatism generated by the heat absorption by the lens 201 and the aberration generation amount predicted in step S602 is smaller than a predetermined threshold value, it is determined that the correction can follow the change of the astigmatism.

If it is determined in step S603 that the correction can follow the change of the astigmatism, the process advances to step S605. In step S605, the controller 100 controls the temperature regulator 108 via the temperature controller 111, thereby immediately applying the heating amount calculated in step S602 to the lens 201. With this, the desired correction residual can be achieved.

On the other hand, if it is determined in step S603 that the correction cannot follow the change of the astigmatism, even if the heating amount calculated in step S602 is applied to the temperature regulator 108, the desired correction residual cannot be achieved. Accordingly, in this case, the process advances to step S604. In step S604, forced aberration correction is executed. The forced aberration correction includes at least one of processes listed below:

(a) a process of applying a temperature distribution to the lens 201 by light irradiation (that is, by 0th-order light) without using the original, thereby generating the aberration having the opposite sign to the aberration amount generated by the lens 201 due to the exposure light;

(b) a process of heating by the temperature regulator 108, thereby generating the aberration having the opposite sign to the aberration amount generated by the lens 201 due to the exposure light;

(c) stopping the lot processing until the state is achieved in which the change of the astigmatism generated by heating the lens 201 by the temperature regulator 108 can follow the change of the astigmatism generated by the heat absorption by the lens 201 during the exposure time; and (d) a process of cooling the lens 201 until the state is achieved in which the change of the astigmatism generated by heating the lens 201 by the temperature regulator 108 can follow the change of the astigmatism generated by the heat absorption by the lens 201 during the exposure time.

Figure 7A:
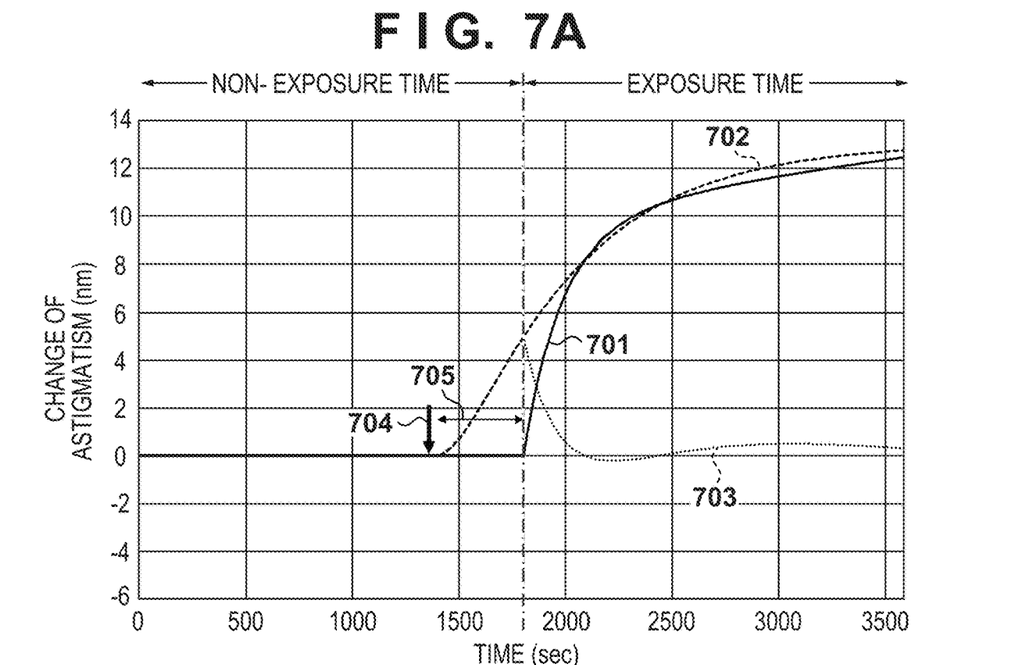
FIGS. 7A and 7B are graphs for explaining the effect of the astigmatism correction process.
Figure 7B:
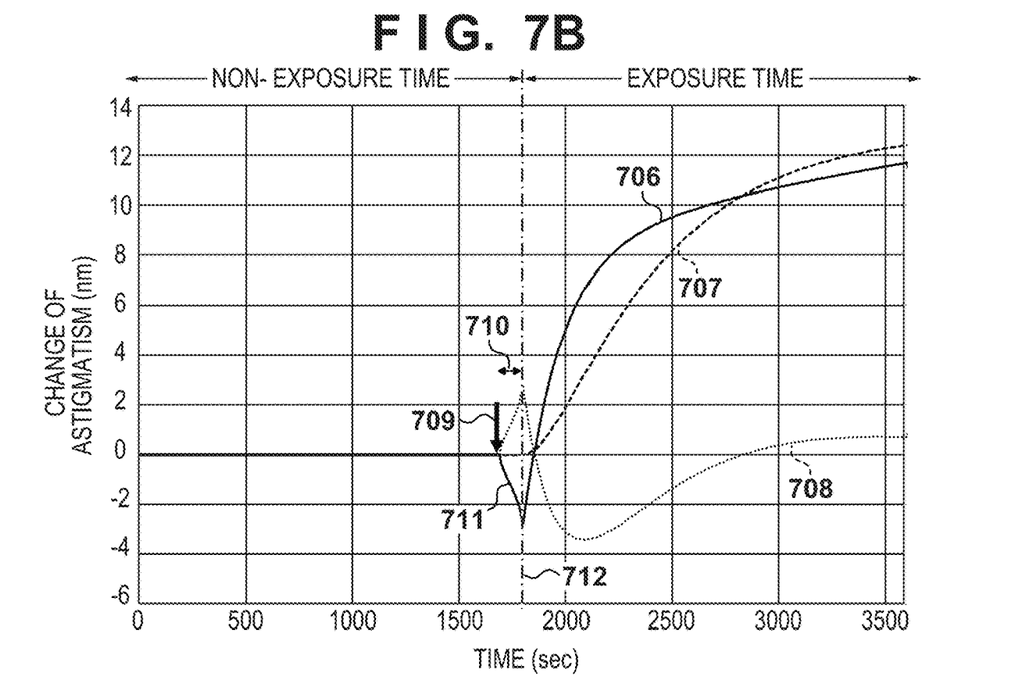

With reference to FIGS. 7A and 7B, examples of the effects of the correction process illustrated in FIG. 6 will be described. Each of FIGS. 7A and 7B shows an improvement example of the correction residual in a case in which the reception timing of the exposure job is changed with respect to the temporal characteristic of the change of the astigmatism shown in FIG. 5.

In the example shown in FIG. 7A, a reception timing 704 of the exposure job is earlier than the reception timing 504 of the exposure job in FIG. 5, and a period 705 from the timing 704 to the assumed start timing of the exposure operation is of about 400 sec. Here, assume that the predetermined threshold value for the time difference between the assumed start timing of the exposure operation and the reception timing of the exposure job, which is used to determine whether the correction by heating the lens 201 by the temperature regulator 108 can follow the change of the aberration during the exposure time, is set to 300 sec. In this case, the period 705 is longer than the threshold value. Then, in step S603, it is determined that the correction by applying the heating amount calculated in step S602 to the lens 201 by the temperature regulator 108 can follow the temporal change of the astigmatism generated by the heat absorption of the lens 201 during the exposure time. Accordingly, in this case, in step S605, the controller 100 starts the correction process by heating the lens 201 by the temperature regulator 108 immediately after the timing 704. With this, the astigmatism generated by heating the lens 201 by the temperature regulator 108, which is expressed by a curve 702, corrects the change of the astigmatism generated by the heat absorption by the lens 201 during the exposure time, which is expressed by a curve 701. The correction residual at this time, which is expressed by a curve 703 in FIG. 7A, is reduced by an average of 1.5 nm with respect to the correction residual expressed by the curve 503 in FIG. 5.

Also in the example shown in FIG. 7B, assume that the above-described predetermined threshold value is set to 300 sec as in the above description concerning FIG. 7A. In FIG. 7B, a reception timing 709 of the exposure job is earlier than the reception timing 504 of the exposure job in FIG. 5 by about 100 sec. In other words, a period 710 from the reception timing 709 to the assumed start timing of the exposure operation is longer than the period 505 shown in FIG. 5 by about 100 sec. However, the period 710 is shorter than the threshold value. Accordingly, it is determined in step S603 that the correction by applying the heating amount calculated in step S602 to the lens 201 by the temperature regulator 108 cannot follow the temporal change of the astigmatism generated by the absorption of the light beam by the lens 201 during the exposure time. Therefore, in this case, the controller 100 executes the forced aberration correction in step S604.

Here, assume that as the forced aberration correction, a process is executed in which a temperature distribution is applied to the lens 201 by 0th-order light to generate the aberration having the opposite sign (negative direction) to the aberration amount generated by the lens 201 due to the exposure light. With this process, the astigmatism of −2.8 nm can be generated as expressed by a curve 711. Thereafter, in step S605, at an assumed start timing 712 of the exposure operation, the controller 100 controls the temperature regulator 108 via the temperature controller 111 to start the correction by applying the heating amount calculated in step S602 to the lens 201. As a result, the astigmatism generated by heating the lens 201 by the temperature regulator 108, which is expressed by a curve 707, follows the astigmatism generated by the heat absorption by the lens 201 during the exposure time, which is expressed by a curve 706, thereby correcting (canceling) the astigmatism. The correction residual at this time, which is expressed by a curve 708 in FIG. 7B, is reduced by an average of 1.2 nm with respect to the correction residual expressed by the curve 503 in FIG. 5.

Figure 8A:
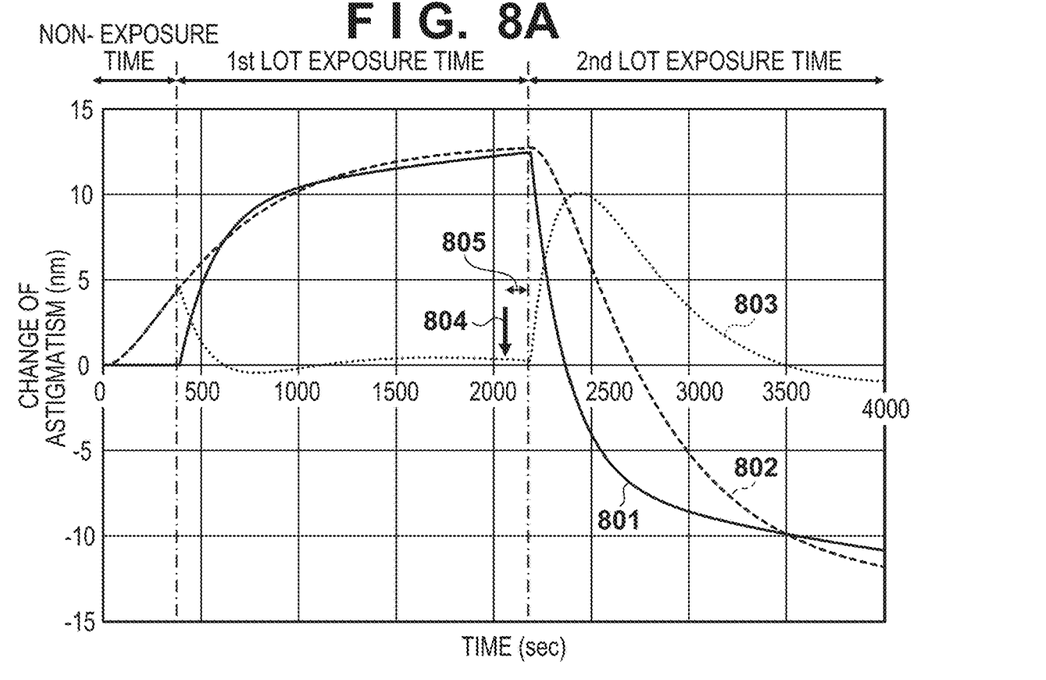
FIGS. 8A and 8B are graphs for explaining the effect of the astigmatism correction process in a case in which lot processing operations of two lots are performed successively.
Figure 8B:
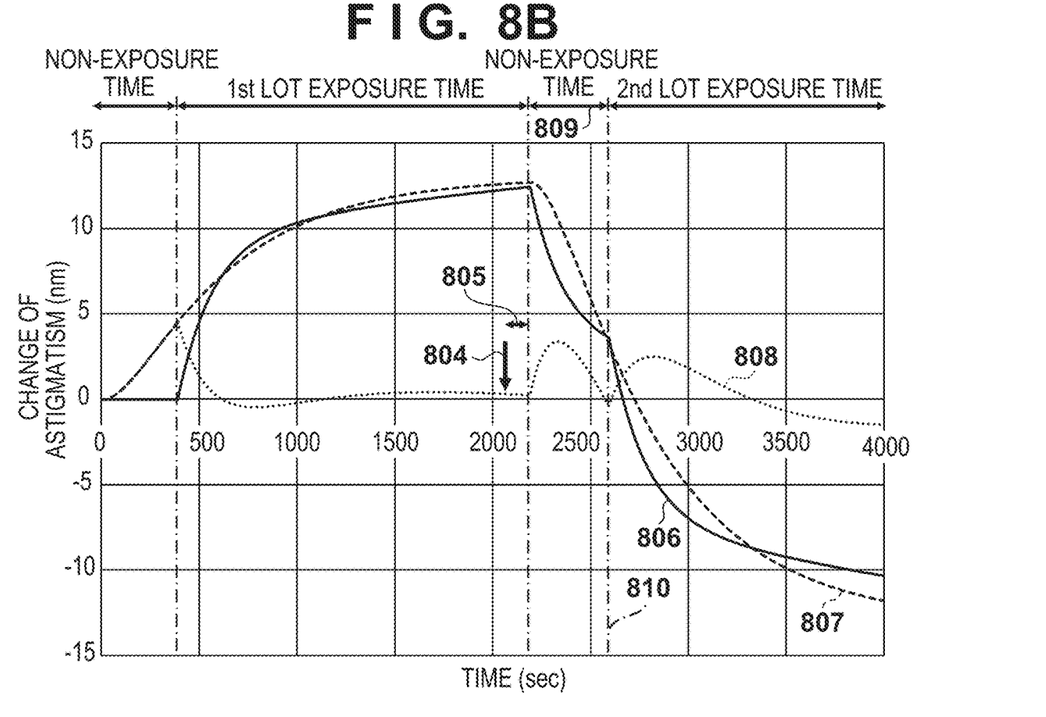

FIGS. 8A and 8B show an example of improvement of the correction residual by the correction process in a case in which an exposure job of next lot processing is submitted during the lot processing.

In FIG. 8A, the same characteristic as in FIG. 7A is shown in the period from 0 sec to 2,200 sec. Here, it is planned to execute the first lot processing including a series of exposure operations on a plurality of substrates in the first lot, and the second lot processing including a series of exposure operations on a plurality of substrates in the second lot after the first lot processing. However, a reception timing 804 of the exposure job of the second lot by the controller 100 is close to the end of the lot processing of the first lot, and about 100 sec before the assumed start timing of the exposure operation of the second lot. That is, a period 805 from the timing 804 to the assumed start timing of the exposure operation of the second lot is of about 100 sec. Assuming that the predetermined threshold value for the time difference between the assumed start timing of the exposure operation and the reception timing of the exposure job is set to about 300 sec as in the above description concerning FIG. 7A, the period 805 is shorter than the threshold value. Accordingly, it is determined in step S603 that the astigmatism generated by applying the heating amount calculated in step S602 to the lens 201 by the temperature regulator 108 cannot follow the change of the astigmatism generated by the absorption of the light beam by the lens 201 during the exposure time. Therefore, in this case, the controller 100 executes the forced aberration correction in step S604.

FIG. 8B shows the result obtained by executing the forced aberration correction in step S604 since the exposure job of the second lot was received at the timing 804 as in FIG. 8A. Here, as the forced aberration correction, a method is executed in which the lot processing is stopped until the state is achieved in which the change of the astigmatism generated by heating the lens 201 by the temperature regulator 108 can follow the change of the astigmatism generated by the heat absorption by the lens 201 during the exposure time. With this method, the lot processing is stopped in a period 809 of about 400 sec. With this, the aberration generated by the exposure for the first lot can be reduced by 8 nm. In addition, during this stop period, heating of the lens 201 by the temperature regulator 108 in step S605 can be executed. In this manner, a waiting period is provided so as to reduce the aberration of the projection optical system 107 before the second lot processing is started. With this, the astigmatism generated by heating the lens 201 by the temperature regulator 108, which is expressed by a curve 807, follows the change of the astigmatism generated from an exposure start timing 810 of the second lot, which is expressed by a curve 806, thereby correcting (canceling) the astigmatism. The correction residual at this time during the exposure time of the second lot, which is expressed by a curve 808 in FIG. 8B, can be reduced by an average of 2.7 nm with respect to the correction residual expressed by a curve 803 in FIG. 8A.

Figure 9:
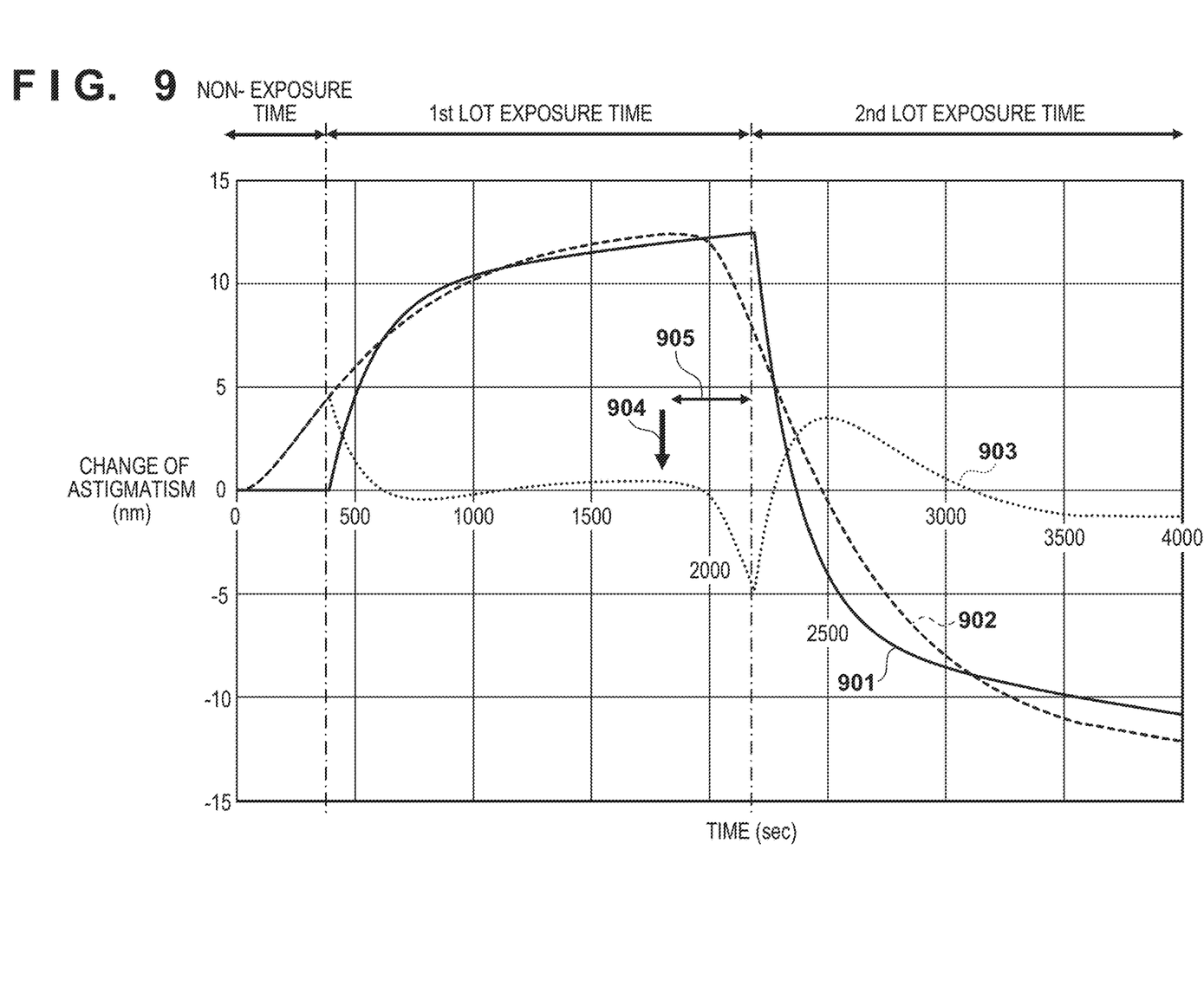
FIG. 9 is a graph for explaining the effect of the astigmatism correction process in a case in which lot processing operations of two lots are performed successively.

FIG. 9 shows another example of the result of the correction process in the case in which the exposure job of next lot processing is received during the lot processing. The same characteristic of the first lot as in FIGS. 8A and 8B is shown in FIG. 9 and, as in the example shown in FIGS. 8A and 8B, it is planned to start the lot processing of the second lot immediately after the lot processing of the first lot is complete. In FIG. 9, a reception timing 904 of the exposure job of the second lot is about 400 sec before the assumed start timing of the exposure operation of the second lot. That is, a period 905 from the reception timing 904 to the assumed start timing of the exposure operation of the second lot is of about 400 sec. Assuming that the predetermined threshold value for the time difference between the assumed start timing of the exposure operation and the reception timing of the exposure job is set to 300 sec as in the above descriptions concerning FIG. 7A and FIG. 8A, the period 905 is longer than the threshold value. Accordingly, it is determined in step S603 that the astigmatism generated by applying the heating amount calculated in step S602 to the lens 201 by the temperature regulator 108 can follow the change of the astigmatism generated by the absorption of the light beam by the lens 201 during the exposure time. Therefore, in this case, the forced aberration correction in step S604 is not executed, and heating of the lens 201 by the temperature regulator 108 is executed in step S605 as usual. With this, the astigmatism generated by heating the lens 201 by the temperature regulator 108, which is expressed by a curve 902, follows the change of the astigmatism generated by the heat absorption by the lens 201 during the exposure time of the second lot, which is expressed by a curve 901, thereby correcting (cancelling) the astigmatism. The correction residual at this time during the exposure time of the second lot, which is expressed by a curve 903 in FIG. 9, can be reduced by an average of 3.0 nm with respect to the correction residual expressed by the curve 803 in FIG. 8A.

Second Embodiment

As has been described above, since the start timing of the exposure operation in the lot processing is planned and decided by the user, the accurate time difference between the submission timing of the exposure job of the lot processing and the start timing of the exposure operation in the lot processing corresponding to this is unknown. Therefore, the start timing of the exposure operation can be decided by at least one of statistical calculation from the past operational performance of the apparatus, prediction from the lot information and the apparatus status at the reception timing of the exposure job, and the like.

However, with these methods, if a sudden abnormality occurs, it is difficult to decide the accurate time. To solve this problem, in this embodiment, in order to decide the more accurate time, information of the conveyance time of the substrate to an exposure apparatus 10 is acquired from a preprocessing device that performs a preprocess on the substrate and, based on the acquired information, decides the assumed start timing. The preprocessing device can be a coating/developing device (coater/developer) that performs a process of coating a substrate with a resist (photosensitive agent) as a preprocess for the exposure process and also performs a developing process as a postprocess for the exposure process.

Figure 10:
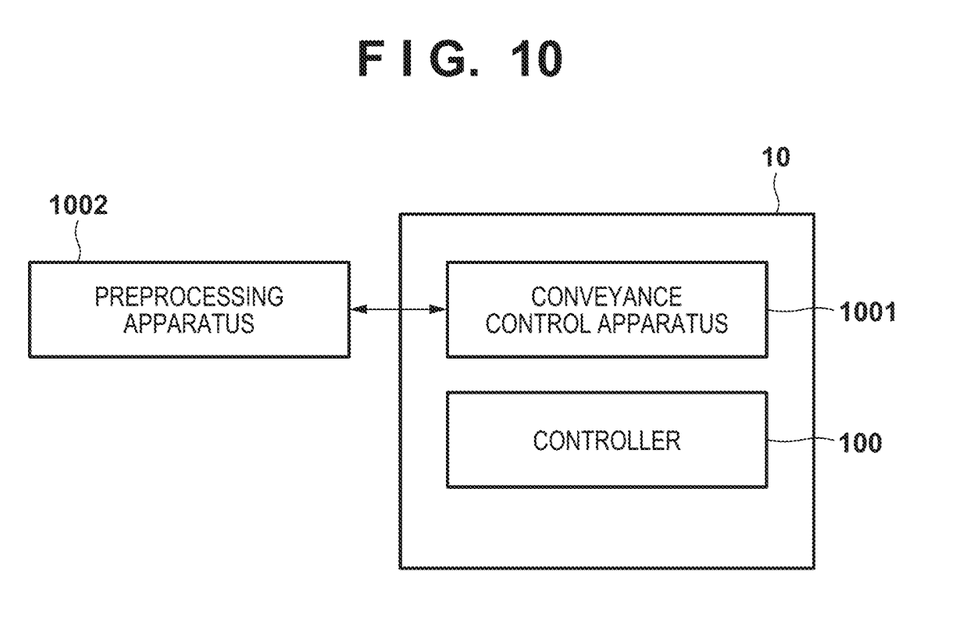
FIG. 10 is a block diagram showing a configuration example of a control system related to substrate conveyance.

FIG. 10 shows a configuration example of a control system related to substrate conveyance. As shown in FIG. 10, the exposure apparatus 10 can include a controller 100 and a conveyance control device 1001. Note that the arrangement of the exposure apparatus 10 except for the controller 100 and the conveyance control device 1001 follows FIG. 1, and illustration thereof is omitted in FIG. 10. The conveyance control device 1001 regularly inquires a preprocessing device 1002 about the scheduled loading timing of the first substrate in the succeeding lot. In response to the inquiry, the preprocessing device 1002 calculates the conveyance timing of the substrate to the exposure apparatus 10 based on the substrate processing status and the substrate supply status in the preprocessing device 1002, and notifies the conveyance control device 1001 of the information. The conveyance control device 1001 transmits the notified information to the controller 100. Based on the received information of the conveyance timing of the substrate to the exposure apparatus 10, the controller 100 decides the assumed start timing.

As has been described above, by using the information notified from the preprocessing device 1002, it is possible to decide the assumed start timing with high accuracy.

Third Embodiment

Figure 11:
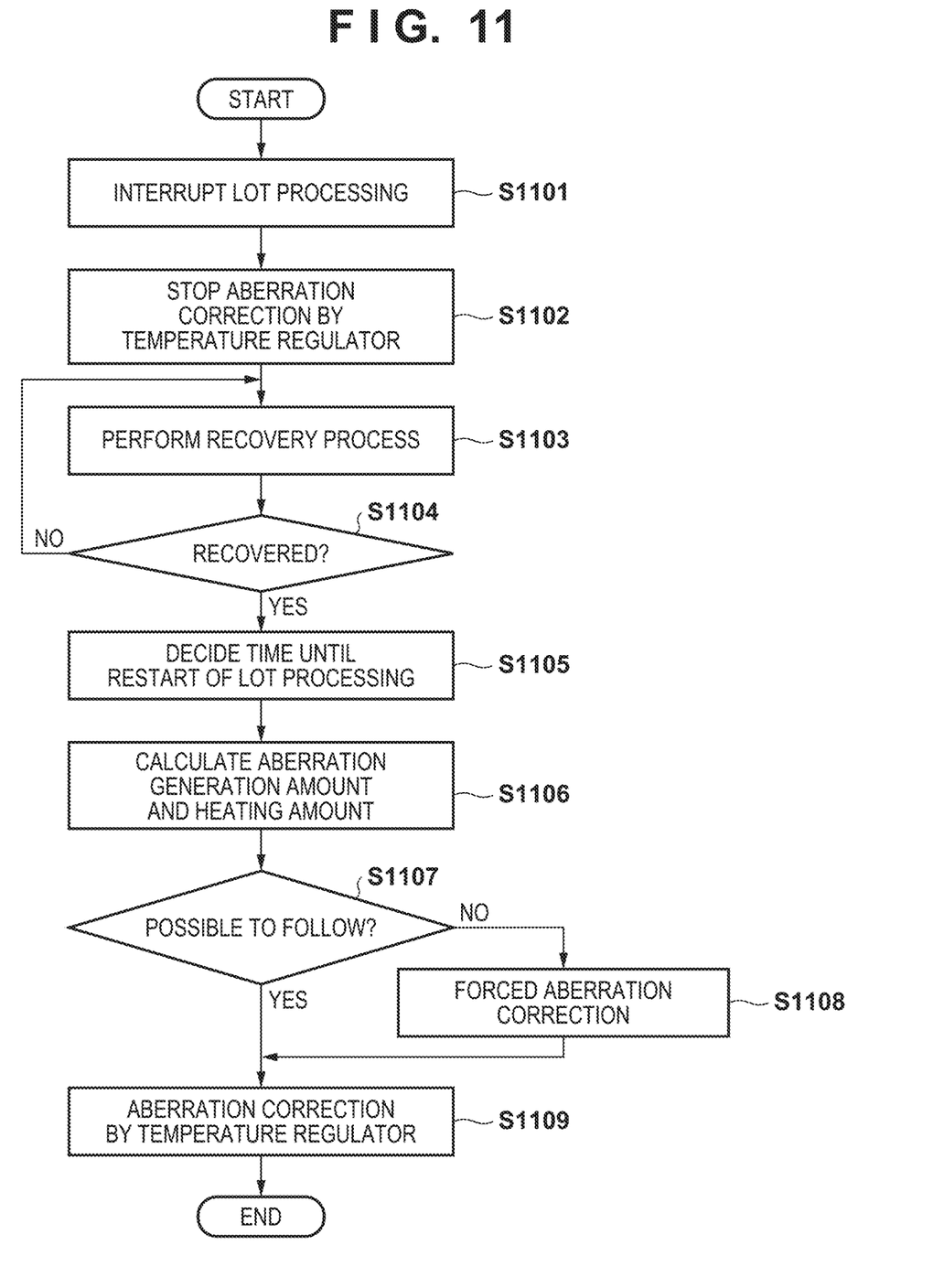
FIG. 11 is a flowchart illustrating an aberration correction process in a case in which lot processing is interrupted.

FIG. 11 is a flowchart illustrating an aberration correction process in a case in which an error occurs during lot processing and the lot processing is interrupted.

In step S1101, as a predetermined event, a controller 100 detects interruption of the currently executing lot processing (a series of exposure operations). In step S1102, the controller 100 stops the aberration correction process by a temperature regulator 108 performed during the lot processing. In step S1103, a recovery process for the error that has occurred is performed. The recovery process may be manually performed by the engineer, or may be automatically performed by an exposure apparatus 10.

In step S1104, the controller 100 determines whether the recovery process in step S1103 is complete. If the recovery process is not complete, the process returns to step S1103. If the recovery process is complete, the process advances to step S1105.

In step S1105, the controller 100 decides the time until the restart of the lot processing. The time until the restart of the lot processing may be decided using a preset time, or may be decided based on the contents of the error that have caused the interruption of the lot processing, the contents of the performed recovery process, or the like.

In step S1106, the controller 100 predicts the aberration generation amount based on the time decided in step S1105 and the lot information, and calculates the heating amount to be applied to a lens 201 by the temperature regulator 108 required to correct the predicted aberration.

Contents of subsequent steps S1107, S1108, and S1109 are similar to those of steps S603, S604, and S605 of FIG. 6, respectively.

Fourth Embodiment

Figure 12:
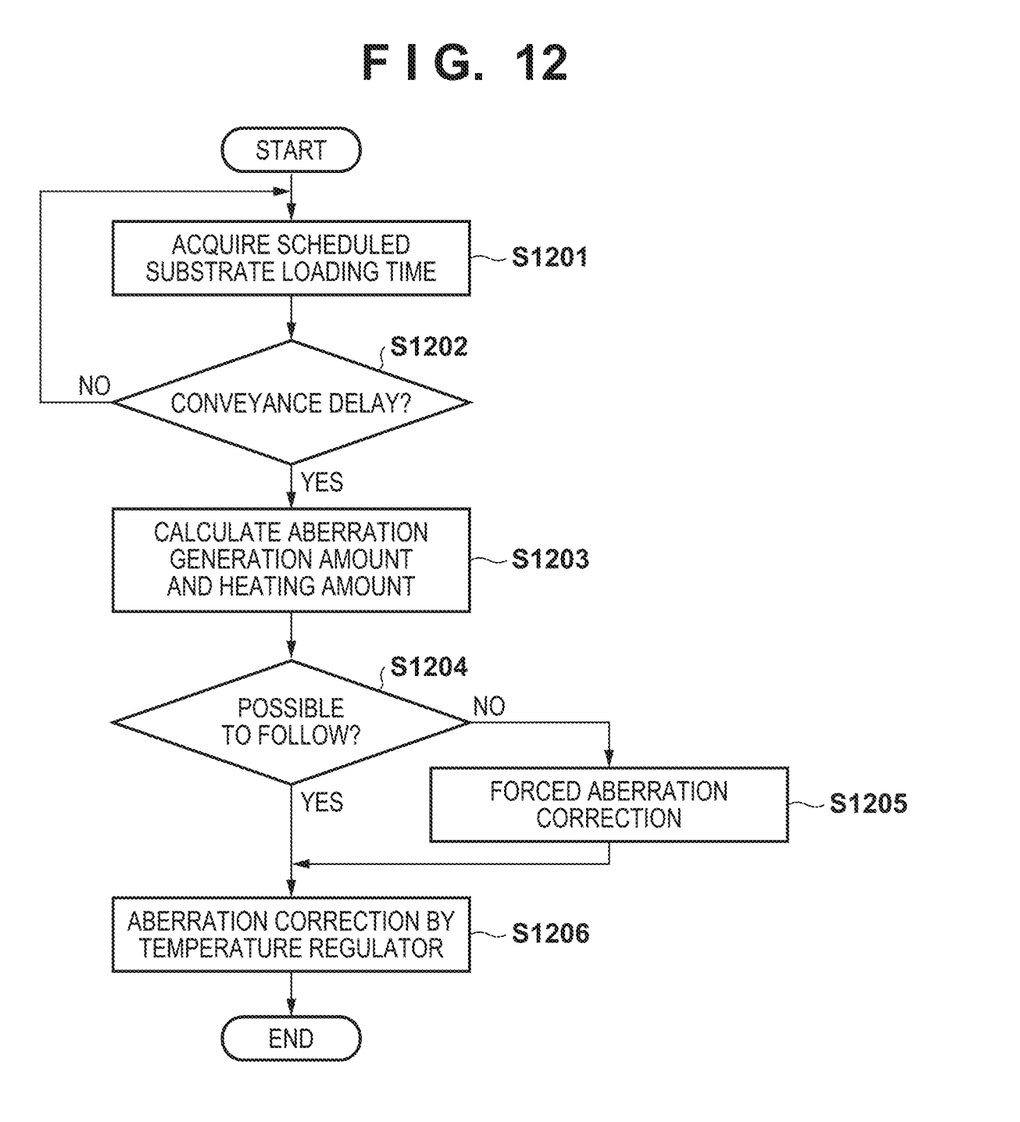
FIG. 12 is a flowchart illustrating an aberration correction process in a case in which a delay has occurred in conveyance of a substrate during lot processing.

FIG. 12 is a flowchart illustrating an aberration correction process in a case in which a delay has occurred in conveyance of a substrate during lot processing.

In step S1201, a controller 100 acquires the scheduled substrate loading time notified from, for example, a preprocessing device 1002. In step S1202, the controller 100 determines, based on the acquired scheduled loading time, whether a substrate conveyance delay has occurred. For example, when there is no substrate in an exposure apparatus 10, if the scheduled substrate loading time notified from the preprocessing device 1002 is later than a scheduled time by a predetermined time or more, a conveyance delay is detected as a predetermined event. If no conveyance delay has occurred, the process returns to step S1201. If a conveyance delay has been detected, the process advances to step S1203.

In step S1203, the controller 100 predicts the aberration generation amount based on the scheduled substrate loading time acquired in step S1201 and the lot information, and calculates the heating amount to be applied to a lens 201 by a temperature regulator 108 required to correct the predicted aberration.

Contents of subsequent steps S1204, S1205, and S1206 are similar to those of steps S603, S604, and S605 of FIG. 6, respectively.

<Embodiment of Article Manufacturing Method>

An article manufacturing method according to an embodiment of the present invention suitably manufactures an article, for example, a microdevice such as a semiconductor device or an element having a microstructure. The article manufacturing method of this embodiment includes a step of forming a latent pattern by using the above-described exposure apparatus on a photosensitive agent applied on a substrate (an exposure step of exposing the substrate), and a development step of developing the substrate exposed in the exposure step. Further, the article manufacturing method includes a processing step of processing the substrate developed in the development step. The processing step includes other well-known steps (oxidation, film formation, deposition, doping, planarization, etching, resist removal, dicing, bonding, packaging, and the like). In the article manufacturing method, an article is obtained from the substrate processed in the processing step. The article manufacturing method of this embodiment is more advantageous than the conventional methods in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-067118, filed Apr. 14, 2022, which is hereby incorporated by reference herein in its entirety.

What is claimed is:

1. An exposure apparatus that performs a first exposure operation of exposing a plurality of substrates of a first lot via a projection optical system and a second exposure operation of exposing a plurality of substrates of a second lot, to be exposed after the first lot, via the projection optical system, the apparatus comprising:
   a temperature regulator configured to regulate a temperature distribution on an optical element of the projection optical system; and
   a controller configured to perform, in an exposure operation period in which the second exposure operation is executed, a first process of controlling the temperature regulator so as to reduce a change of aberration of the projection optical system caused by execution of the second exposure operation,
   wherein, in a case in which the controller receives an instruction for an exposure job of the second lot during the first exposure operation, and determines that a time difference between an assumed start timing of the second exposure operation and a reception timing of the instruction for the exposure job of the second lot is smaller than a predetermined threshold value, the controller performs, in a non-exposure operation period between the first exposure operation and the second exposure operation and before performing the first process, a second process for reducing the aberration of the projection optical system using a method different from the first process.

2. The apparatus according to claim 1, wherein the controller is configured to, upon detecting an interruption of the first exposure operation or the second exposure operation, determine a time until the interrupted exposure operation is restarted, and predict an amount of aberration of the projection optical system based on the determined time.

3. The apparatus according to claim 1, wherein the temperature regulator is arranged outside an effective diameter of the optical element, and is configured to partially apply heat to the optical element by the first process.

4. The apparatus according to claim 3, wherein the second process includes one of controlling a temperature distribution applied to the optical element by light irradiation, providing a waiting period before entering the exposure operation period, and cooling the optical element.

5. The apparatus according to claim 1, wherein upon detecting a conveyance delay of the substrate, the controller obtains a scheduled loading time of the substrate and predicts an amount of aberration of the projection optical system based on the obtained scheduled loading time.

6. The apparatus according to claim 1, wherein the controller acquires information of a conveyance time of the substrate to the exposure apparatus from a preprocessing device that performs a preprocess on the substrate and, based on the acquired information, decides the assumed start timing.

7. The apparatus according to claim 1, wherein each of the first process and the second process is a process of reducing astigmatism as the aberration.

8. An exposure method of performing a first exposure operation of exposing a plurality of substrates of a first lot via a projection optical system and a second exposure operation of exposing a plurality of substrates of a second lot, to be exposed after the first lot, via the projection optical system, the method comprising:
   performing, in an exposure operation period in which the second exposure operation is executed, a first process of controlling a temperature distribution on an optical element of the projection optical system by a temperature regulator so as to reduce a change of aberration of the projection optical system caused by execution of the second exposure operation, and
   performing, in a case in which an instruction for an exposure job of the second lot is received during the first exposure operation, and it is determined that a time difference between an assumed start timing of the second exposure operation and a reception timing of the instruction for the exposure job of the second lot is smaller than a predetermined threshold value, a second process for reducing the aberration of the projection optical system using a method different from the first process, the second process being performed in a non-exposure operation period between the first exposure operation and the second exposure operation and before performing the first process.

9. An article manufacturing method comprising:
exposing a substrate by an exposure method defined in claim 8;
developing the substrate exposed in the exposing; and
processing the substrate developed in the developing,
wherein an article is obtained from the substrate processed in the processing.

* * * * *